United States Patent
Gigante et al.

(10) Patent No.: US 11,408,922 B2
(45) Date of Patent: Aug. 9, 2022

(54) METHOD AND SYSTEM FOR DETECTING MISWIRING OF A POWER SUPPLY FOR A DOMESTIC APPLIANCE

(71) Applicant: WHIRLPOOL CORPORATION, Benton Harbor, MI (US)

(72) Inventors: Alessandro Gigante, Comerio (IT); Erik P. Oosterwal, Dowagiac, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 9 days.

(21) Appl. No.: 17/142,287

(22) Filed: Jan. 6, 2021

(65) Prior Publication Data

US 2021/0126446 A1     Apr. 29, 2021

Related U.S. Application Data

(63) Continuation of application No. 16/139,757, filed on Sep. 24, 2018, now Pat. No. 10,910,819, which is a continuation of application No. 15/062,664, filed on Mar. 7, 2016, now Pat. No. 10,109,996.

(51) Int. Cl.
| | |
|---|---|
| *G01R 31/67* | (2020.01) |
| *G01R 25/00* | (2006.01) |
| *H02H 3/16* | (2006.01) |
| *H02H 11/00* | (2006.01) |
| *G01R 31/50* | (2020.01) |

(52) U.S. Cl.
CPC ............. *G01R 25/00* (2013.01); *G01R 31/50* (2020.01); *G01R 31/67* (2020.01); *H02H 3/165* (2013.01); *H02H 11/002* (2013.01)

(58) Field of Classification Search
CPC ........ G01R 25/00; G01R 31/67; G01R 31/50; H02H 3/165; H02H 11/002
See application file for complete search history.

(56) References Cited

U.S. PATENT DOCUMENTS

| | | |
|---|---|---|
| 5,600,524 A | 2/1997 | Neiger et al. |
| 5,828,309 A | 10/1998 | Kumakura et al. |
| 6,040,778 A | 3/2000 | Hopkins et al. |
| 6,807,035 B1 | 10/2004 | Baldwin et al. |
| 7,400,476 B1 * | 7/2008 | Hull, Jr. ............... H02H 11/002 361/42 |
| 8,781,784 B2 | 7/2014 | Jenski et al. |
| 9,488,687 B2 | 11/2016 | Matsumura et al. |
| 9,813,010 B2 | 11/2017 | Iwanami et al. |
| 2002/0097546 A1 | 7/2002 | Weinberger |
| 2003/0165037 A1 | 9/2003 | Liscinksy |
| 2007/0014313 A1 | 1/2007 | Bickel et al. |
| 2008/0007880 A1 | 1/2008 | Bradley et al. |

(Continued)

FOREIGN PATENT DOCUMENTS

DE     10214738 A1     10/2003

*Primary Examiner* — Scott Bauer
(74) *Attorney, Agent, or Firm* — McGarry Bair PC

(57) ABSTRACT

A system for detecting miswiring in an AC power supply for an appliance may comprise a phase sensor sensing the phase difference between the first and a second hot line powering heavy electrical loads therebetween, and a control module coupling to the phase and voltage sensors. The control module may identify a fault condition and may disconnect different electrical loads from the power supply in the fault condition.

18 Claims, 7 Drawing Sheets

(56) References Cited

U.S. PATENT DOCUMENTS

| | | | |
|---|---|---|---|
| 2008/0020627 A1* | 1/2008 | Sexton | H02H 3/38 |
| | | | 439/404 |
| 2008/0167826 A1* | 7/2008 | Murry | G01R 31/67 |
| | | | 702/58 |
| 2009/0160663 A1 | 6/2009 | Silverman et al. | |
| 2010/0007447 A1 | 1/2010 | Mernyk | |
| 2012/0191399 A1 | 7/2012 | Jenski et al. | |
| 2015/0109077 A1* | 4/2015 | Tomimbang | H02H 3/10 |
| | | | 335/7 |
| 2017/0025846 A1* | 1/2017 | Du | H02H 3/335 |

* cited by examiner (240V)

Line behaviors in demo conditions

240V

| From Line | Demo Mode L1 tied to L2 | | | Demo Mode L2 disconnected | | | Demo Mode N tied to L2 | | |
|---|---|---|---|---|---|---|---|---|---|
| | L1 | N | L1 | L1 | N | - | L1 | N | N |
| To Appliance | L1 | N | L2 | L1 | N | L2 | L1 | N | L2 |

L1 & L2 zero cross = 0
L1 - N = 120V

No Zero Cross on L2
L1 - N = 120V

No Zero Cross on L2
L1 - N = 120V

| From Line | Demo Mode L1 tied to L2 | | | Demo Mode L2 disconnected | | | Demo Mode N tied to L2 | | |
|---|---|---|---|---|---|---|---|---|---|
| | L1 | N | L1 | L1 | N | - | L1 | N | N |
| To Appliance | L1 | N | L2 | L1 | N | L2 | L1 | N | L2 |

L1 & L2 zero cross = 0
L1 - N = 120V

No Zero Cross on L2
L1 - N = 120V

No Zero Cross on L2
L1 - N = 120V

FIG. 4A  FIG. 4B  FIG. 4C

METHOD AND SYSTEM FOR DETECTING MISWIRING OF A POWER SUPPLY FOR A DOMESTIC APPLIANCE

CROSS-REFERENCE TO RELATED APPLICATION(S)

This application is a continuation of U.S. patent application Ser. No. 16/139,757, filed on Sep. 24, 2018, issued as U.S. Pat. No. 10,910,819, on Feb. 2, 2021, which is a continuation of U.S. patent application Ser. No. 15/062,664, filed Mar. 7, 2016, issued as U.S. Pat. No. 10,109,996, on Oct. 23, 2018, both of which are incorporated herein by reference in their entirety.

BACKGROUND OF THE INVENTION

Domestic appliances may be powered by split-phase (240V) or three-phase (208V) alternating current (AC) power supplies that are miswired at the outlet, the power cord, or internal to the appliance, potentially causing damage to or malfunction in the appliance. Typically, light electrical loads, such as fans, lights, and displays, are powered by a single 120V side (L1 leg) of a split-phase supply, whereas heavy electrical loads, such as a heating element, are powered at 240V between two hot lines (L1 and L2). One solution to the risks of miswiring can be found in prior art reference U.S. Pat. No. 8,781,784 ("System and method for detecting miswiring of an electrical appliance") where all appliance loads are disconnected when a phase difference between supply hot lines L1 and L2 is detected to be 0 degrees. Unfortunately, a phase difference of 0 degrees occurs when either the L1 or L2 hot lines and the neutral line are reversed, causing light electrical loads powered on the L1 side to be unnecessarily disabled in the case of the low-risk scenario of L1 and neutral being swapped. The user is then left without fans, lights, and/or displays in situations where they could be safely provided.

Also, the technique in the prior art of using a zero-degree L1-L2 phase difference to disable all electrical loads may prevent lights and display from operating in a showroom demonstration where the L1 supply may be wired to feed both L1 and L2 of the appliance input. Intentional rewiring may be necessary when 240V power supplies are not practically available on a showroom floor, but it remains desirable to demonstrate the lights and display of an appliance. Further, the prior art use of a zero-degree phase relationship may yield a false positive in the case of a three-phase 208V power supply, where 2 of the utilized hot lines are 120 degrees offset from each other, and the swapping of a hot and neutral line yields a 30 degree or 330 degree offset between L1 and L2. In this case, a dangerous miswire condition may occur yet the prior art may fail to disconnect the heavy electrical load.

SUMMARY OF THE INVENTION

In one aspect, the disclosure relates to a system for detecting miswiring in an alternating-current (AC) power supply having a first hot line, a second hot line, and a neutral line, for an appliance having a light electrical load powerable between the first hot line and the neutral line, and a heavy electrical load powerable between the first and the second hot lines. The system includes a zero-crossing detector configured to sense a voltage of the second hot line relative to the neutral line and a control module coupled to the zero-crossing detector to receive the sensed voltage and identify a fault condition indicating that the second hot line is either disconnected or tied to the neutral line when there is no zero crossing sensed by the zero-crossing detector and the voltage signal does not exceed a sum of a nominal voltage by a voltage threshold. When the appliance is connected to the AC power supply, the system is configured to disconnect only the heavy electrical load from the AC power supply in the fault condition In another aspect, the disclosure relates to a method for detecting miswiring in an alternating-current (AC) power supply having a first hot line, a second hot line, and a neutral line, for an appliance having a light electrical load powerable between the first hot line and the neutral line, and a heavy electrical load powerable between the first and the second hot lines. The method includes collecting a voltage signal representative of a voltage of the second hot line relative to the neutral line, detecting a fault condition indicating that the second hot line is either disconnected or tied to the neutral line when there is no zero crossing sensed by the zero-crossing detector and the voltage signal does not exceed a sum of a nominal voltage by a voltage threshold; and disconnecting only the heavy electrical load from the AC power supply in the fault condition when the appliance is connected to the AC power supply.

BRIEF DESCRIPTION OF THE DRAWINGS

In the drawings:

FIGS. 4A-4C illustrate voltage and phase conditions in a single-phase scenario of a system for detecting miswiring of a power supply for a domestic appliance, in accordance with an embodiment of the present disclosure.

DETAILED DESCRIPTION

Figure 1A:
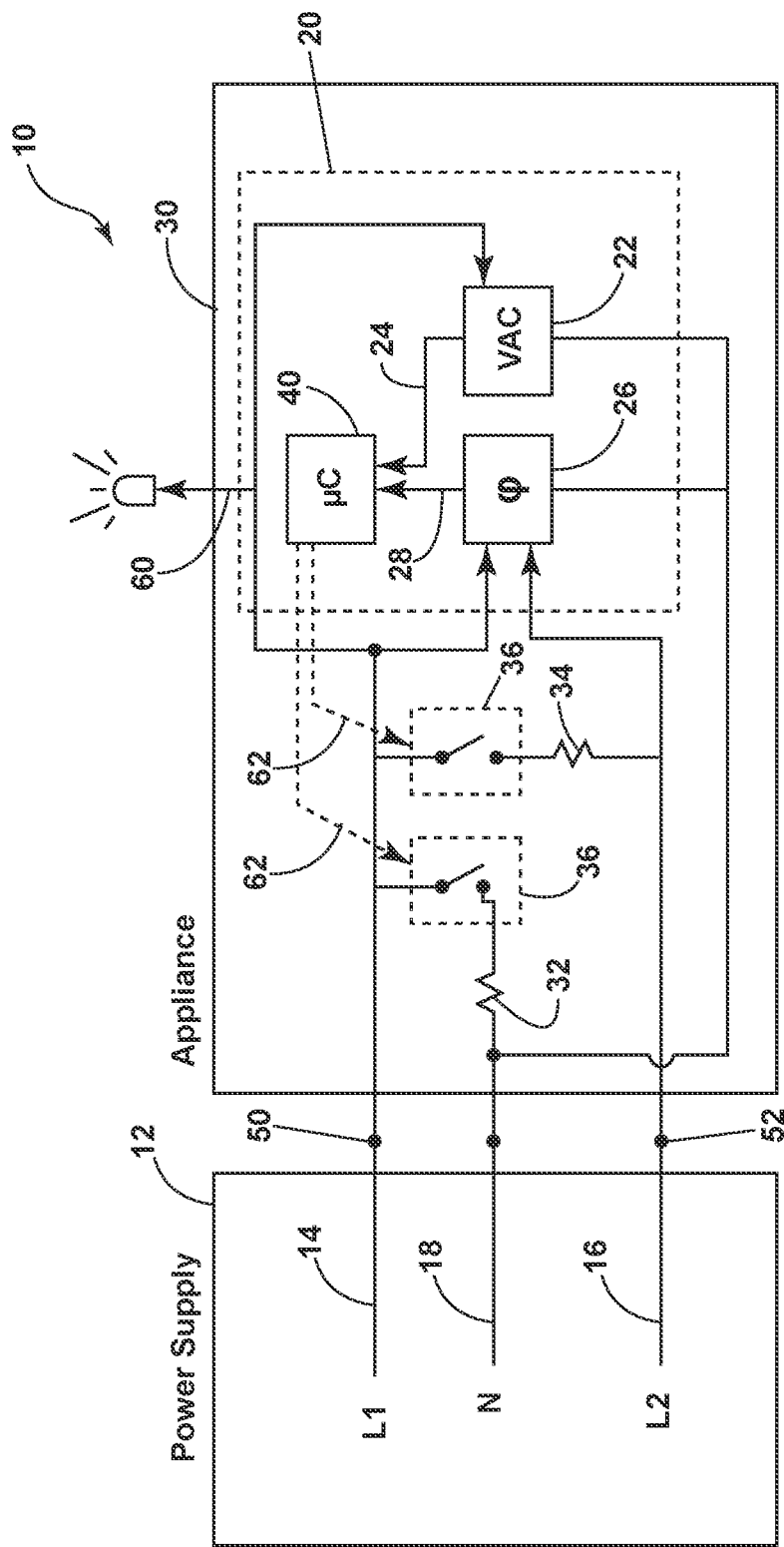
FIGS. 1A-1B illustrate a control module placement in a system for detecting miswiring of a power supply for a domestic appliance, in accordance with an embodiment of the present disclosure

As may be appreciated, based on the disclosure, there exists a need in the art for a system for detecting miswiring of a power supply for a domestic appliance that discriminates between L1 and L2 being swapped with the neutral line of the power supply. Furthermore, there exists a need in the art for a system for detecting miswiring that allows light electrical loads powered from one leg of the power supply to remain operational under low-risk miswiring scenarios such as on a showroom floor where a multi-phase power supply may not be available. Additionally, there exists a need in the art for a system for detecting miswiring that correctly indicates a high-risk miswiring scenario in a 208 three-phase power supplies.

Referring to FIGS. 1A through 6, in an embodiment, a system 10 for detecting miswiring in an alternating-current (AC) power supply 12 may have a first hot line 14 (L1), a second hot line 16 (L2), and a neutral line 18 (N). An appliance 30 may have a light electrical load 32 powerable between the first hot line 14 and the neutral line 18 and may have a heavy electrical load 34 powerable between the first 14 and the second 16 hot lines. Power supply 12 may be a 240 volt split-phase system where hot lines 14 and 16 are each approximately 120 volts sinusoids nominally out of phase with each other by 180 degrees (FIG. 2A). Power supply 12 may also be a 208 volt three-phase system (not shown) comprising a neutral line and three 120 volt sinusoids out of phase with each other by approximately 120 degrees or 240 degrees (FIG. 3A), where 2 of the three available hot lines are utilized by the appliance. Heavy electrical load 34 may be one or more heating elements, and may be powered between L1 (14) and L2 (16). Relays 36 may disconnect the heavy electrical load 34 from the power supply and be a simple relay such as K2 and K10 in FIG. 6, or may be a double line break (DLB) relay, a common safety feature. Light electrical load 32 may also be disconnected from the L1 (14) side of the power supply through one or more relays 36 controlled by relay control line 62 (FIGS. 1A-2A).

Continuing with FIGS. 1A through 6, the system 10 may comprise a voltage sensor 22 (FIGS. 1A and 6) configured to send a voltage signal 24 representative of a potential difference 50 between the first hot line 14 and the neutral line 18. The system 10 may also comprise a phase sensor 26 (FIG. 1A) configured to send a phase signal 28 representative of the phase difference (FIGS. 2A-4C) between the first hot line and the second hot line. For example, in a normally operating system, where the L1 and L2 hot lines and the neutral line of the supply are correctly wired to the corresponding appliance terminals, a nominal voltage of the first hot line 50 may be approximately 120 volts rms (FIGS. 2A and 3A), which may result in a "Yes" output from voltage test block 80 in FIG. 5. L1 leg 14 may then power the light electrical loads 32 such as lights, displays, and/or fans. The system 10 may also comprise a control module 20 coupled to receive the voltage signal 24 and the phase signal 28 and may identify a first fault condition 82 (FIGS. 2B, 3B, and 5) indicating that the second hot line 16 and the neutral line 18 are reversed when the voltage signal 24 exceeds the nominal voltage of the first hot line 14 by a voltage threshold ("T" in FIG. 5), and may also identify a second fault condition 96 (FIGS. 2C, 3C, and 5) indicating that the first hot line 14 and the neutral line 18 are reversed when the phase signal 28 is within a phase threshold 56 ("D+30" in FIG. 5) measured from 0 degrees. In an embodiment, the second fault condition may also require that the voltage signal 24 does not exceed a sum of the nominal voltage and the voltage threshold T.

Figure 2A:
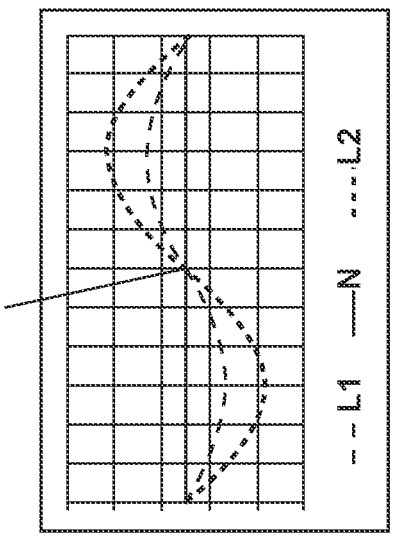
FIGS. 2A-2C illustrate voltage and phase conditions in a 240V split phase system for detecting miswiring of a power supply for a domestic appliance, in accordance with an embodiment of the present disclosure.
Figure 2B:
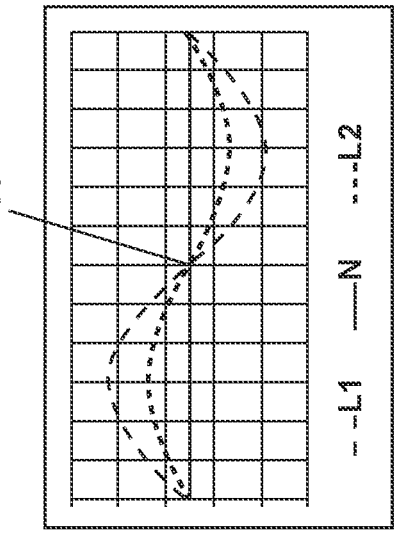
Figure 2C:
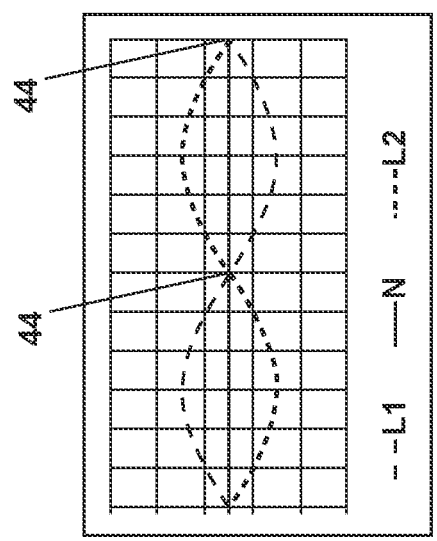
Figure 3A:
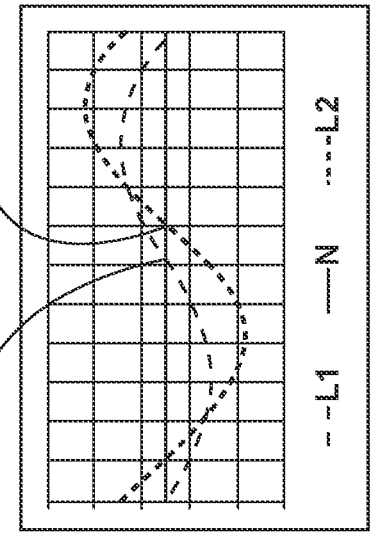
FIGS. 3A-3C illustrate voltage and phase conditions between two phases in a three-phase 208V system for detecting miswiring of a power supply for a domestic appliance, in accordance with an embodiment of the present disclosure.
Figure 3B:
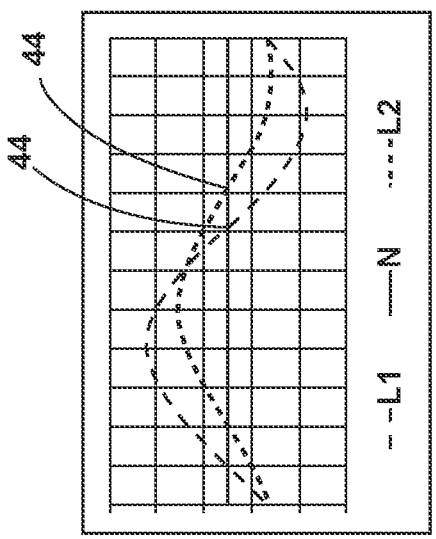
Figure 3C:
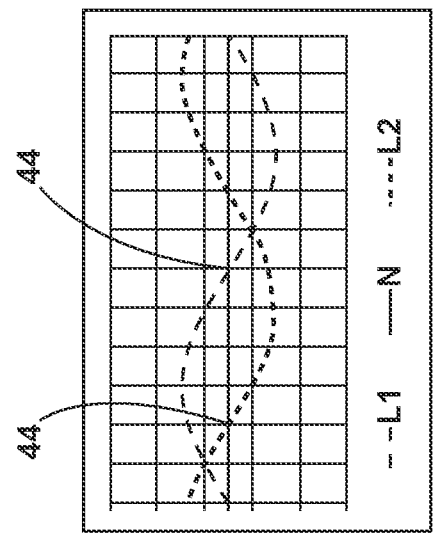
Figure 5:
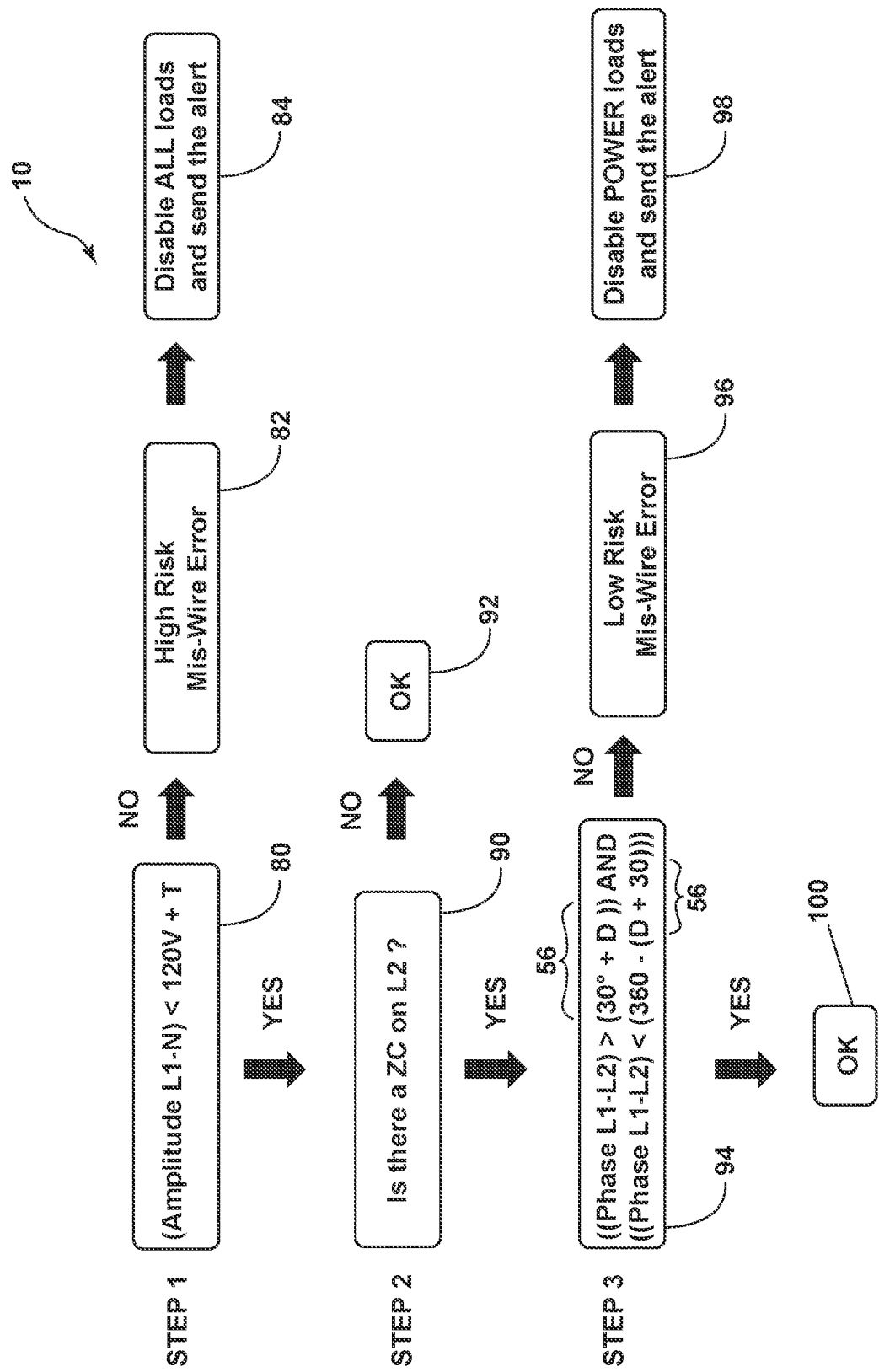
FIG. 5 illustrates a fault detection algorithm in a system for detecting miswiring of a power supply for a domestic appliance, in accordance with an embodiment of the present disclosure.

Continuing, in an embodiment, the second fault condition 96 may require that the phase signal 28 is within a phase threshold 56 measured from zero degrees and may also require that the voltage signal 24 does not exceed a sum of the nominal voltage and the voltage threshold T. For example, in a power supply, L1 (14) and N (18) may be reversed and may cause a "L1-N" voltage of approximately 120 volts (FIGS. 2C and 3C, Step 1 of FIG. 5), a valid zero crossing 44 for L2 (("Yes" from block 90 of FIG. 5), and a phase difference of approximately 0 degrees (±phase threshold) between L1 and L2 (FIGS. 2C and 3C, a "No" for Step 3 of FIG. 5). When the appliance 30 is connected to the AC power supply 12, the system 10 may be configured to disconnect the heavy electrical load 34 and the light electrical load 32 from the AC power supply 12 in the first fault condition 84, and may be configured to disconnect only the heavy electrical load 34 from the AC power supply 12 in the second fault condition 98. The control module may be further configured to send an alert signal 60 (FIG. 1A) in at least one of the first fault condition 84 and the second fault condition 98. Relay control line 62 may extend from control module 20 to relays 36 in order to connect or disconnect loads 32 and 34 from power supply 12.

Referring still to FIGS. 1A through 6, in various embodiments, the choice of L1 for powering light electrical loads 32 may be arbitrary, and for example L2 may be chosen to power loads 32 instead of L1 as both L1 and L2 may provide equivalent voltages 50 and 52 respectively and equivalent current capacity. Advantageously, it may be unnecessary to measure the voltage of the second hot line 52 with respect to neutral line 18 since voltage 50 provides an accurate indicator of miswiring. The voltage threshold (T in FIG. 5) may be chosen to prevent errors by allowing a margin for supply line fluctuation and the presence of noise. Voltage threshold may be preferably set to approximately 40 volts in order to allow for variations in the supply voltage 50 which may, for example, vary from approximately 110V to approximately 140V. A voltage threshold of at least approximately 20 volts may be utilized to determine an L2/N swap when L1 varies over a narrower range of voltage, such as from approximately 115-125 volts.

Referring now to FIGS. 2A-3C and FIG. 5, in various embodiments, phase threshold 56 may provide an allowance for the different phase behaviors of 240V and 208V power supplies, as shown in the tables for FIGS. 2A-3C, and which may be taken into account by the "30" degree term in FIG. 5 block 94. Threshold 56 may also provide a margin for accurately distinguishing between in-phase conditions and out-of-phase conditions, which may be taken into account by the "D" term in FIG. 5. A phase threshold of at least approximately 50 degrees may provide a reliable test (block 94, Step 3 of the algorithm in FIG. 5) of an approximately in-phase condition between L1 and L2 by providing a 30 degree allowance for the case of a 208V supply and an additional 20 degrees to allow for measurement uncertainty due to noise or nominal phase variations. Preferably, phase threshold 56 may be set to approximately 75 degrees, and the phase threshold may be a sum of D (45 degrees) and 30 degrees. Since the phase difference between L1 and L2 may be positive or negative, an L1/N swap (low-risk 96) may be indicated in Step 3 by a phase of <(D+30) or a phase of >(330−D).

Figure 6:
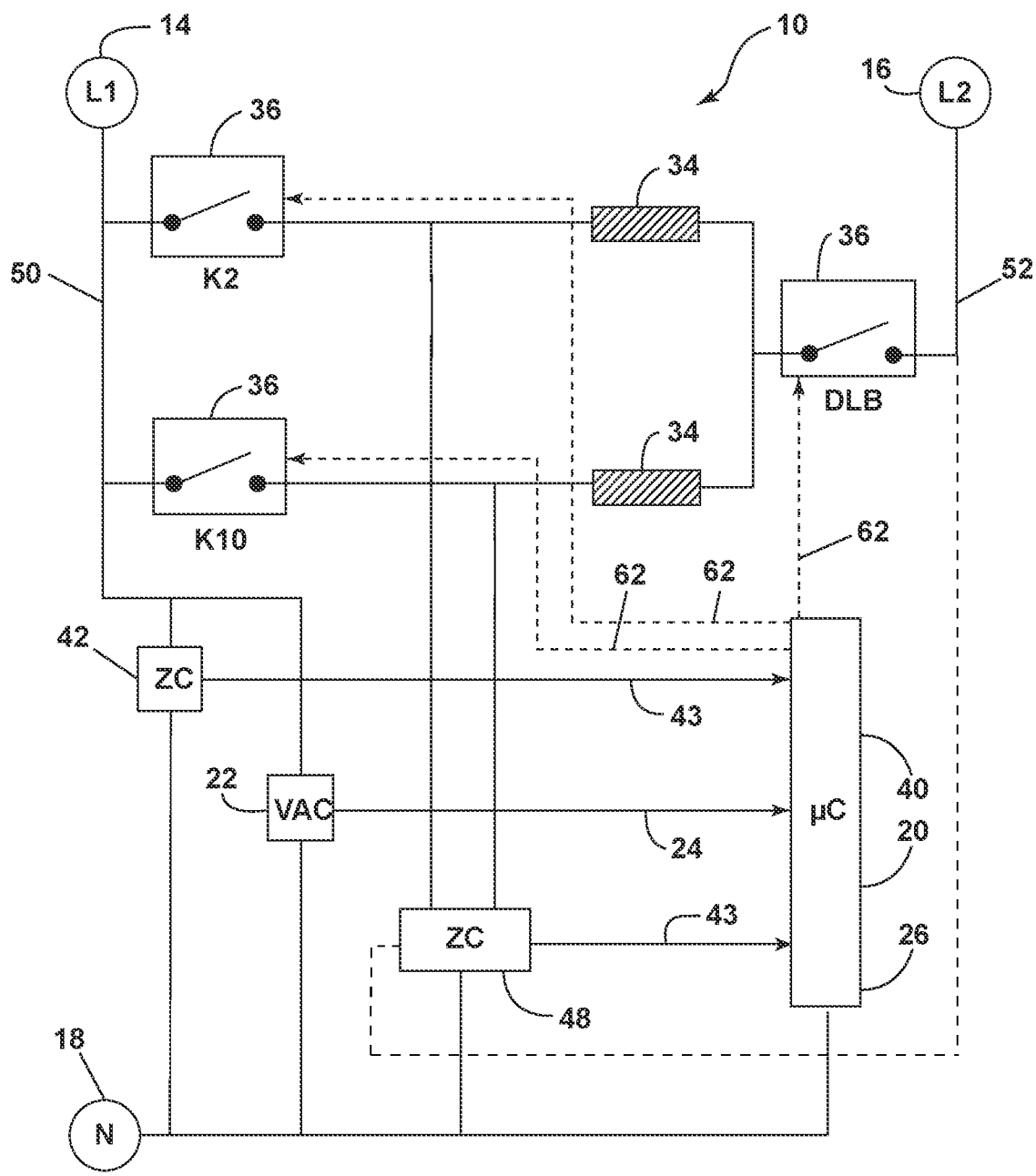
FIG. 6 is a schematic view of a system for detecting miswiring of a power supply for a domestic appliance, in accordance with an embodiment of the present disclosure.

Referring again to FIGS. 1A through 6, in various embodiments, the control module 20 may include the voltage sensor 24 and the phase sensor 26 and may extend sensing lines to L1 (14), L2 (16), and Neutral (18) for collecting the voltage signal 24 and the phase signal 28. Control module 20 may include microcontroller 40 to receive the voltage signal 24 and the phase signal 28 and to identify the first fault condition and the second fault condition. The system may further include a relay 36 each for disconnecting the light electrical load 32 and the heavy electrical load 34 from power supply 12, the relay 36 controllable by control module 20. Phase sensor 26 may comprise any of the well-known methods for sensing phase such as a peak detector, waveform analysis, and/or zero-crossing detectors. The phase sensor 26 may comprise a first zero-crossing detector 42 sensing the voltage of the first hot line 14 relative to neutral line 18, and may further comprise a second zero-crossing detector 48 sensing the voltage of the second hot line 16 relative to neutral line 18. Referring to FIG. 6, in an embodiment, a zero crossing detector 42 may sense the periodic voltage 50 of the first hot line and determine when it crosses the neutral axis as a zero crossing 44, as shown in FIGS. 2A-3C. Zero-crossing detector 48 may sample the second hot line voltage 52 through the low-resistance heavy electrical load 34 of a heating element, and thereby may determine whether one or more of relays 36 (K2, K10, and/or DLB) are closed. In addition, zero-crossing detector 48 may sample the zero crossing signal 43 of L2 (52) through the relay. Optionally, zero-crossing detector 48 may sense the second hot line 16 directly and in front of the relay. By comparing zero-crossing signals 43 from L1 and L2, microcontroller 40 may calculate the phase difference between the L2 and L1 and thereby perform the function of phase sensor 26.

Turning to FIGS. 4A through 6, in various embodiments, system 10 may be configured to connect the heavy and the light electrical loads 32 and 34 to the AC power supply 12 in a third fault condition 92 when there is no zero crossing sensed by the second zero-crossing detector 42 and when the voltage signal 50 does not exceed the nominal voltage by the voltage threshold T. The third fault condition may indicate that the second hot line supply 16 is either disconnected from the appliance 30 or is tied to the neutral line supply 18. Various embodiments of power supply miswiring may occur in a showroom floor scenario where 240V/208V supplies may not be available. For example, it may be desirable to power up the light electrical loads of an appliance (but not necessarily the heavy electrical loads) in order to demonstrate the look and some functionality of an appliance for sale. In the FIG. 4A scenario, the L1 supply may be wired to the L1 and L2 input of an appliance using a modified 120V supply that is intentionally miswired to the appliance. Voltage sensor 22 may indicate a safe operating voltage of 120V ("Yes" at test block 80) even though an approximately in-phase condition of 0 degrees may be detected by phase sensor 26 ("No" at test block 94), the combination suggesting a low-risk miswiring condition. In this case, the heating element 34 may be disconnected from the supply 12 by control module 20 and an alert sent. Advantageously, unlike the prior art relying on phase detection alone to shut off all loads, a product demonstration may proceed using operational lights, fans, and/or displays. In an alternative, a demonstration mode may be initiated through a display/control panel (not shown) on the appliance in order to disable any annoying alert tones or troubling display modes.

Referring still to FIGS. 4A-4C and 5, in various embodiments, supply leg L2 may be missing or the L2 pin connected to supply neutral line 18 in other demonstration modes (FIGS. 4B, 4C), resulting in a "no zero crossing" result for L2 ("No" for test block 90). Demonstration modes 4B and 4C may be detected by the present invention as a low-risk miswiring (block 92) resulting in either a "no heat" (FIG. 4B) or "low heat" (FIG. 4C) functionality for heating element 34. In an embodiment, no alert (error) may be sent in the case of a third fault detection because this condition is likely to occur only in a showroom demonstration scenario. Should the "no zero crossing" event be detected by the second zero-crossing detector in a home environment, the consumer may be alerted to a miswiring by the failure of the heating element 34 to function properly. Alternatively, an alert may be configured for a "no zero crossing" event notifying a user that an L2 supply is not present. In another embodiment, an alert may be configured for a "no zero crossing" event for L1. Should the tests illustrated in FIG. 5 all result in a "Yes" outcome, a correct wiring may be indicated (block 100), all electrical loads may be connected to power supply 12, and no alert 60 FIG. 1A) may be sent.

Figure 1B:
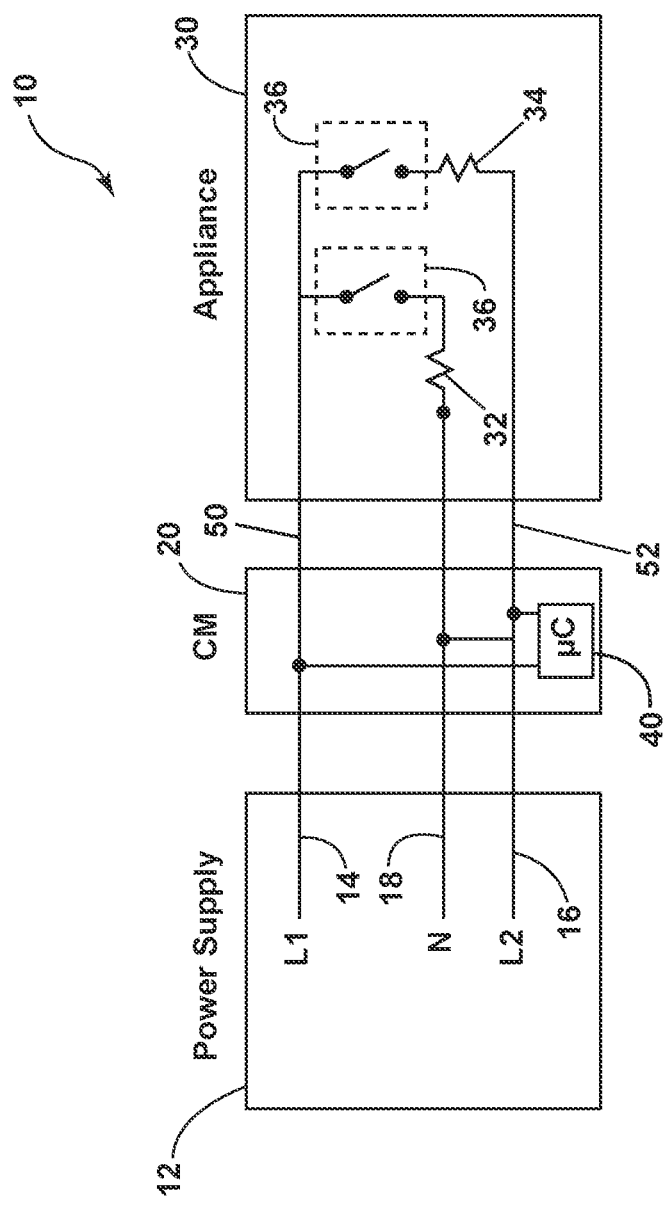

In various embodiments illustrated in FIGS. 1A-1B and FIG. 6, control module 20 may include the voltage sensor 22 and phase sensor 26. Control module 20 may be interposed between appliance 30 and power supply 12 as a separate unit and may function to detect the first, second, and/or third fault conditions. In an embodiment, an interposed control module 20 may pass supply lines 14, 16, and 18 to appliance 30. An interposed control module 20 may activate the connection and disconnection of electrical loads 32 and 34 through various means, such as by transmitting signaling (not shown) through power supply lines to relays inside appliance 30. Alternately, an interposed control module 20 may contain line disconnection circuitry, such as a relay, to interrupt power flow that would otherwise damage the appliance. Additionally, the present disclosure may detect miswiring within the appliance 30 where the power supply wiring is correct, such as in a factory test setting. Beneficially, fault detection circuitry according to the present disclosure may self-diagnose faulty internal wiring and provide an alert to test personnel and protect light electrical loads from damage.

Many other possible embodiments and configurations in addition to that shown in the above figures are contemplated by the present disclosure. To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" or "a plurality of" various elements have been described, it will be understood that "a set" or "a plurality" can include any number of the respective elements, including only one element. Combinations or permutations of features described herein are covered by this disclosure.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for detecting miswiring in an alternating-current (AC) power supply having a first hot line, a second hot line, and a neutral line, for an appliance having a light electrical load powerable between the first hot line and the neutral line, and a heavy electrical load powerable between the first and the second hot lines, the system comprising:

a zero-crossing detector configured to sense a voltage of the second hot line relative to the neutral line;

a control module coupled to the zero-crossing detector to receive the sensed voltage and identify a fault condition indicating that the second hot line is either disconnected or tied to the neutral line when there is no zero crossing sensed by the zero-crossing detector and the voltage signal does not exceed a sum of a nominal voltage by a voltage threshold; and wherein when the appliance is connected to the AC power supply, the system is configured to disconnect only the heavy electrical load from the AC power supply in the fault condition.

2. The system of claim 1 further comprising a phase sensor configured to send a phase signal representative of a phase difference between the first hot line and the second hot line when the phase signal is within a phase threshold measured from 0 degrees.

3. The system of claim 1 further comprising a second zero-crossing detector configured to send a voltage signal representative of a potential difference between the first hot line and the neutral line.

4. The system of claim 1, wherein the nominal voltage is approximately 120 volts and the voltage threshold is at least approximately 20 volts.

5. The system of claim 2, wherein the control module includes the voltage sensor and the phase sensor and is interposed between the appliance and the AC power supply.

6. The system of claim 1, wherein the control module is configured to send an alert signal in response to the fault condition.

7. The system of claim 1, wherein the phase threshold is at least approximately 50 degrees.

8. The system of claim 1, wherein the power supply is one of a 240 volt split-phase system and a 208 volt three-phase system.

9. The system of claim 1, wherein the phase sensor comprises a first zero-crossing detector sensing the voltage of the first hot line relative to the neutral line, and further comprises a second zero-crossing detector sensing the voltage of the second hot line relative to the neutral line.

10. The system of claim 1, wherein the control module is contained within the appliance.

11. The system of claim 1, further comprising a relay each for disconnecting the light electrical load and the heavy electrical load from the power supply, the relay controllable by the control module.

12. A method for detecting miswiring in an alternating-current (AC) power supply having a first hot line, a second hot line, and a neutral line, for an appliance having a light electrical load powerable between the first hot line and the neutral line, and a heavy electrical load powerable between the first and the second hot lines, the method comprising:

collecting a voltage signal representative of a voltage of the second hot line relative to the neutral line;

detecting a fault condition indicating that the second hot line is either disconnected or tied to the neutral line when there is no zero crossing sensed by the zero-crossing detector and the voltage signal does not exceed a sum of a nominal voltage by a voltage threshold; and disconnecting only the heavy electrical load from the AC power supply in the fault condition when the appliance is connected to the AC power supply.

13. The method of claim 12, further comprising sending an alert signal in response to detecting the fault condition.

14. The method of claim 12, further comprising collecting a phase signal representative of a phase difference between the first hot line and the second hot line.

15. The method of claim 12, wherein the power supply is one of a 240 volt split-phase system and a 208 volt three-phase system.

16. The method of claim 12 further comprising collecting a voltage signal representative of a potential difference between the first hot line and the neutral line.

17. The method of claim 16, wherein the voltage signal does not exceed a sum of the nominal voltage and a voltage threshold in the fault condition.

18. The method of claim 17, wherein the nominal voltage is approximately 120 volts and the voltage threshold is at least approximately 20 volts.

* * * * *